United States Patent
Ziaei et al.

(10) Patent No.: US 10,770,640 B2
(45) Date of Patent: Sep. 8, 2020

(54) CAPACITIVE RF MEMS INTENDED FOR HIGH-POWER APPLICATIONS

(71) Applicant: THALES, Courbevoie (FR)

(72) Inventors: Afshin Ziaei, Vanves (FR); Matthieu Le Baillif, Orsay (FR); Paolo Martins, Massy (FR); Shailendra Bansropun, Paris (FR)

(73) Assignee: THALES, Courbevoie (FR)

( * ) Notice: Subject to any disclaimer, the term of this patent is extended or adjusted under 35 U.S.C. 154(b) by 563 days.

(21) Appl. No.: 15/538,632

(22) PCT Filed: Dec. 23, 2015

(86) PCT No.: PCT/EP2015/081127
§ 371 (c)(1),
(2) Date: Jun. 21, 2017

(87) PCT Pub. No.: WO2016/102650
PCT Pub. Date: Jun. 30, 2016

(65) Prior Publication Data
US 2017/0358729 A1   Dec. 14, 2017

(30) Foreign Application Priority Data
Dec. 23, 2014  (FR) ...................................... 14 02972

(51) Int. Cl.
*H02N 1/08* (2006.01)
*H02N 10/00* (2006.01)
(Continued)

(52) U.S. Cl.
CPC ............ *H01L 41/08* (2013.01); *B81B 3/0021* (2013.01); *B81B 7/0019* (2013.01); *H01G 5/16* (2013.01);
(Continued)

(58) Field of Classification Search
CPC . H01L 41/08; H01L 41/09333; B81B 7/0019; B81B 2201/018; H01G 5/16;
(Continued)

(56) References Cited

U.S. PATENT DOCUMENTS 6,373,007 B1 * 4/2002 Calcatera ........... H01H 59/0009
200/181
9,711,289 B2 * 7/2017 Van Kampen ........... H01G 5/16
(Continued)

FOREIGN PATENT DOCUMENTS

EP      0 709 911 A2    5/1996
FR      2 930 370 A1   10/2009
(Continued)

OTHER PUBLICATIONS

EPO's communication (Article 94.3 CBE) issued in European Patent Application No. 15828494.3 dated Mar. 26, 2020.

*Primary Examiner* — Thomas M Dougherty
(74) *Attorney, Agent, or Firm* — Baker & Hostetler LLP

(57) ABSTRACT

According to one aspect of the invention, there is proposed a capacitive radiofrequency MicroElectroMechanical System or capacitive RF MEMS comprising a metallic membrane suspended above an RF transmission line and resting on ground planes, and exhibiting a lower face, an upper face opposite to the lower face and a first layer comprising a refractory metallic material at least partially covering the upper face of the membrane so as to prevent the heating of the membrane.

10 Claims, 3 Drawing Sheets

(51) Int. Cl.
  *H01L 45/00* (2006.01)
  *H01L 41/08* (2006.01)
  *H01H 59/00* (2006.01)
  *B81B 7/00* (2006.01)
  *B81B 3/00* (2006.01)
  *H01G 5/16* (2006.01)
  *H01G 5/18* (2006.01)
  *H01H 57/00* (2006.01)
  *H01L 41/09* (2006.01)

(52) U.S. Cl.
  CPC .............. *H01G 5/18* (2013.01); *H01H 57/00* (2013.01); *H01H 59/0009* (2013.01); *H01L 41/0933* (2013.01); *B81B 2201/018* (2013.01); *H01H 2057/006* (2013.01)

(58) Field of Classification Search
  CPC ...... H01G 5/18; H01H 57/00; H01H 59/0009; H01H 2057/006
  USPC .................................................. 310/307, 308
  See application file for complete search history.

(56) References Cited

U.S. PATENT DOCUMENTS

| | | | |
|---|---|---|---|
| 9,711,291 B2* | 7/2017 | Knipe | B81B 3/0051 |
| 2004/0124497 A1* | 7/2004 | Rottenberg | H01H 59/0009 257/532 |
| 2005/0242687 A1 | 11/2005 | Kawakubo et al. | |
| 2011/0259717 A1* | 10/2011 | Pillans | H01H 57/00 200/181 |
| 2012/0193685 A1* | 8/2012 | Goldsmith | H01H 59/0009 257/254 |

FOREIGN PATENT DOCUMENTS

| | | |
|---|---|---|
| JP | 2003-340795 A | 12/2003 |
| WO | 2014/165624 A1 | 10/2014 |

* cited by examiner

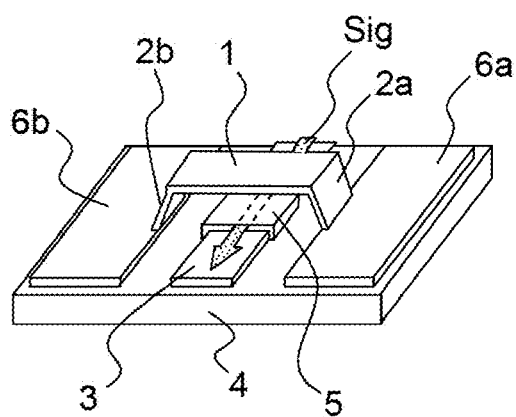
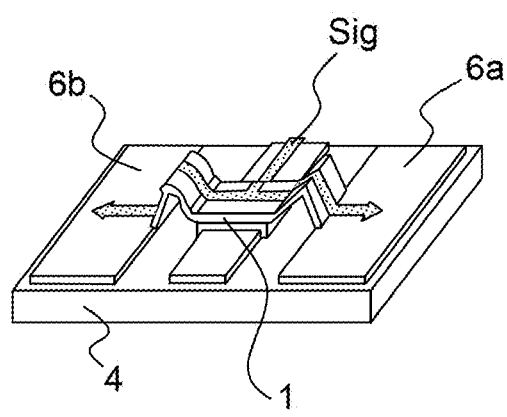
FIG.1a  FIG.1b
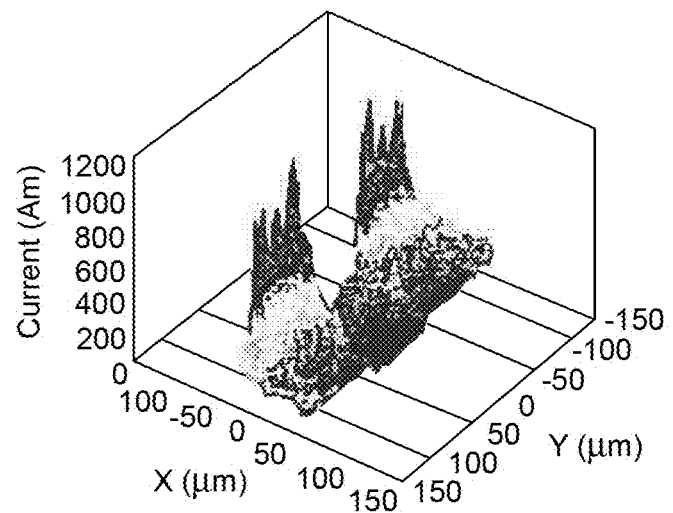
FIG.2

CAPACITIVE RF MEMS INTENDED FOR HIGH-POWER APPLICATIONS

CROSS-REFERENCE TO RELATED APPLICATIONS

This application is a National Stage of International patent application PCT/EP2015/081127, filed on Dec. 23, 2015, which claims priority to foreign French patent application No. FR1402972, filed on Dec. 23, 2014, the disclosures of which are incorporated by reference in their entirety.

FIELD OF THE INVENTION

The field of the invention is that of micro-breakers also referred to as "switches" produced in MicroElectroMechanical System or MEMS technology.

The favored field of application relates to radiofrequency systems, and, more precisely, applications in the field of radars, and in particular, radars using frequencies lying between 8 and 12 GHz. The proposed MEMS components can, however, find applications in fields involving very high frequencies of the order of 150 GHz.

BACKGROUND

The operating principle of MEMS components is as follows.

By means of a drive electrode, an electrostatic force is exerted on a mechanical object of very small dimensions disposed in the vicinity of a radiofrequency transmission line. The displacement or the deformation of the object subjected to this force causes an electronic parameter, which is usually a resistance or a capacitance, to vary. This variation interrupts or restores the transmission of the radiofrequencies in the transmission line. An embodiment of this type of switch is disclosed in FR2930370.

To produce a breaker of capacitive type, suspended-membrane or "bridge" devices are preferentially used.

The operating principle of this type of device is described in the simplest case of the use in micro-breaker, and, is illustrated in FIGS. 1a and 1b which represent respectively a so-called "high" state in which the signal passes and a so-called "low" state in which the signal is short-circuited.

More precisely, a membrane or a metallic beam 1 of small thickness, of the order of 1 μm, is held suspended by pillars 2a, 2b above a radiofrequency transmission line 3 which is produced on the surface of a substrate 4 and in which a signal Sig is propagated.

A dielectric layer 5 is deposited on the surface of the transmission line 3. Conducting lines 6a, 6b, also called ground planes 6a; 6b, are connected to the transmission line 3 and are linked to ground M, not visible in FIGS. 1a and 1b.

The membrane 1 can be subjected to an electrical voltage by means of a drive electrode.

In the absence of applied voltage, the membrane 1 is suspended above the transmission line 3 at a first height or at a first "gap" that may be likened to a first capacitance, typically the first height is greater than 1 micron.

When a sufficiently high electrical voltage is applied to the drive electrode, the membrane 1 is subjected to an electrostatic force which deforms it. The membrane 1 is then separated from the transmission line 3 by a dielectric layer 5 forming a second capacitance which is much greater than the first capacitance formed by the first air gap. Consequently, the radiofrequencies are short-circuited to ground M.

According to the electronic setup, the variation of this capacitance can be used to produce a micro-breaker.

Several studies have demonstrated that when the membrane of an RF MEMS is in the low state, or, in other words, when the RF signal is short-circuited to ground M, relatively sizable electric currents flow in the membrane 1.

FIG. 2 is a graphical representation of a simulation of the densities of current generated in the membrane 1 as a function of the region of the membrane 1 considered when the latter is in the low state, or, in other words, when the signal Sig is shunted or diverted to ground M.

The membrane 1 is defined according to two axes: a first axis Ox has a direction parallel to the direction of propagation of the signal Sig in the transmission line 3, and, a second axis Oy has a direction perpendicular to the direction of propagation of the signal Sig in the transmission line 3.

According to the direction of the axis Ox, three successive zones can be defined:

a first zone Z1 exhibiting a high current of the order of 800 mA a second zone Z2 exhibiting a lower current than that observed on the first zone Z1, the measured currents being of the order of 400 mA a third zone Z3 exhibiting almost zero currents.

FIG. 3 is a schematic representation of a membrane 1 in which a signal Sig flows when the membrane 1 is in the low state.

The passage of the signal Sig generates a potential difference between the parts of the membrane 1 opposite the RF transmission line 3 and the parts of the membrane 1 opposite the ground planes 6a; 6b.

A current density generating a localized temperature increase is then created in the parts of the membrane 1 which link the transmission line 3 to the ground planes 6a; 6b. It is thus possible to define four zones Z1a, Z1b, Z3a and Z3b corresponding to the boundaries of the parts of the membrane 1 which link the transmission line 3 to the ground planes 6a; 6b when the membrane 1 is in the low state.

The current densities generated are dependent on the applied frequency. For frequencies of the order of about ten gigahertz, the currents are estimated at between 0.5 to 1 A.

Similarly, these zones of larger current density are observable when the membrane is in the high state, or, in other words, when the signal passes. However, the differences in current densities between the zones of large and of small current densities are less sizable.

Generally, RF-MEMS components are subjected to a voltage of the order of 10V to allow switching. Under these conditions of use, there is no risk of the membrane 1 being damaged through the temperature rises due to the flow of the current in the membrane 1.

On the other hand, when the power of the signal Sig or the electrical voltage of the order of 30 to 50 V or the frequency of the signal Sig is increased, the flow of the current in the membrane 1, when the latter is in the low state, in particular, causes a sizable increase in the temperature of the membrane 1, and, especially in the zones Z1a, Z1b, Z3a and Z3b in which large current densities are observed, typically the membrane 1 boundaries situated on either side of the transmission line 3, or in other words, opposite the part of the substrate 4 in direct contact with the air of the air gap or on the parts of the membrane which link the transmission line 3 to the ground planes 6a; 6b.

The application of a high power, typically greater than or equal to 15 W, to RF-MEMS risks causing the membrane 1 to burn and leads to immediate failure of the capacitive RF-MEMS.

SUMMARY OF THE INVENTION

An aim of the invention is to propose a capacitive RF MEMS in which the membrane 1 is capable of withstanding high powers or a high frequency.

According to one aspect of the invention, there is proposed a capacitive radiofrequency MicroElectroMechanical System or capacitive RF MEMS comprising a metallic membrane suspended above an RF transmission line and resting on ground planes, and exhibiting a lower face, an upper face opposite to the lower face and a first layer comprising a refractory metallic material at least partially covering the upper face of the membrane so as to prevent the heating of the membrane.

Advantageously, the thickness of the first layer is between 1 and 3 microns.

Preferentially, the first layer of refractory material is disposed on parts of the upper face of the membrane which link the RF transmission line to the ground planes, or, in other words, on the upper face of the membrane opposite a part of the substrate in direct contact with the air of the air gap.

Preferentially, the first layer is disposed on the boundaries of the parts of the upper face of the membrane which link the RF transmission line to the ground planes or in other words of the parts of the membrane which are situated opposite a part of the substrate in direct contact with the air of the air gap.

According to another aspect of the invention, the first layer of refractory metallic material covers the totality of the upper face of the membrane and a second layer covers the totality of the lower face of the membrane, the coefficients of thermal elongation of the first and of the second layer compensate one another so as to contain the deformations of the membrane.

Advantageously, the first layer and the second layer are identical.

Advantageously, the thickness of the first layer and of the second layer is less than or equal to 200 nm.

BRIEF DESCRIPTION OF THE DRAWINGS

The invention will be better understood and other advantages will become apparent on reading the nonlimiting description which follows, and, by virtue of the appended figures among which:

FIGS. 1a and 1b, already described, illustrate an RF line micro-switch in the high state and in the low state, respectively, according to the known art, FIG. 2, already described, is a graphical representation of the current densities generated in the membrane when the latter is in the low state as a function of the zone of the membrane considered, FIG. 3, already described, is a schematic representation of the membrane showing the zones exhibiting a large current density.

DETAILED DESCRIPTION

Figure 3:
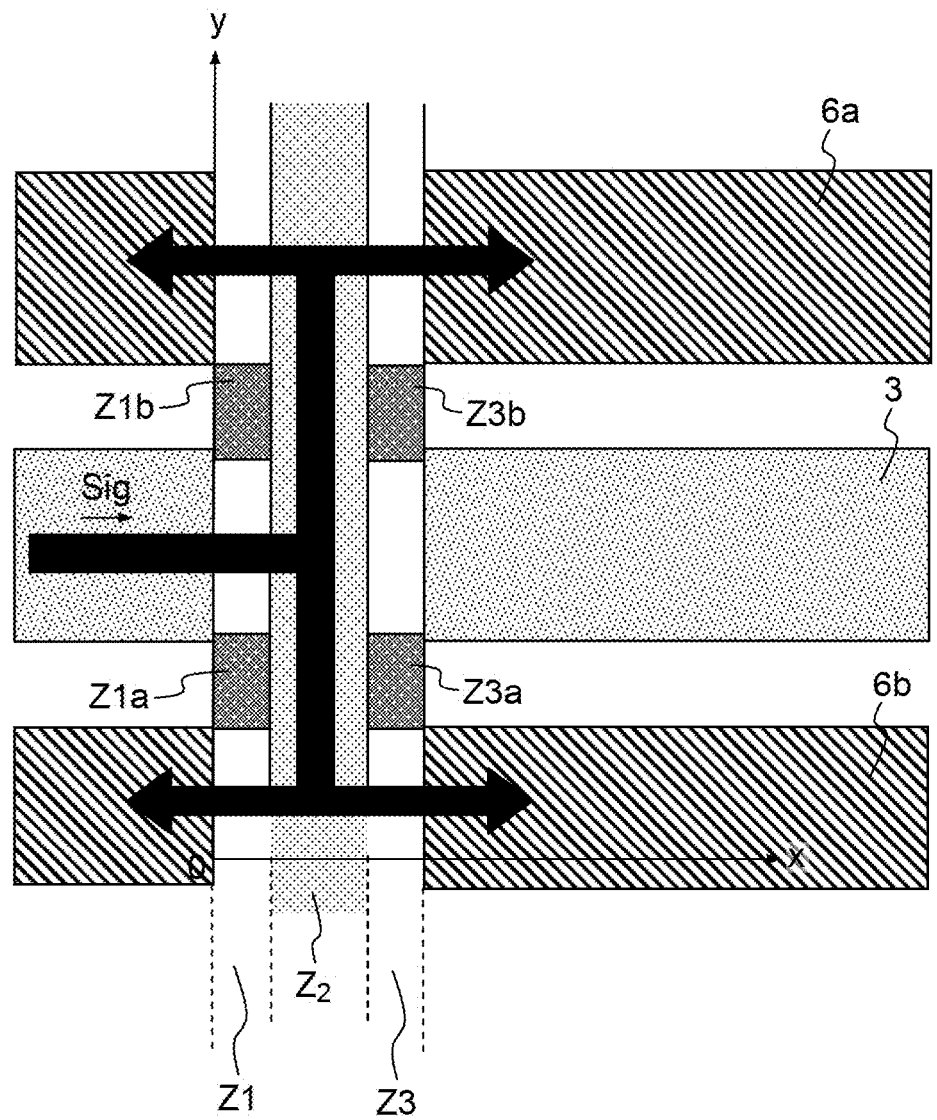
Figure 4:
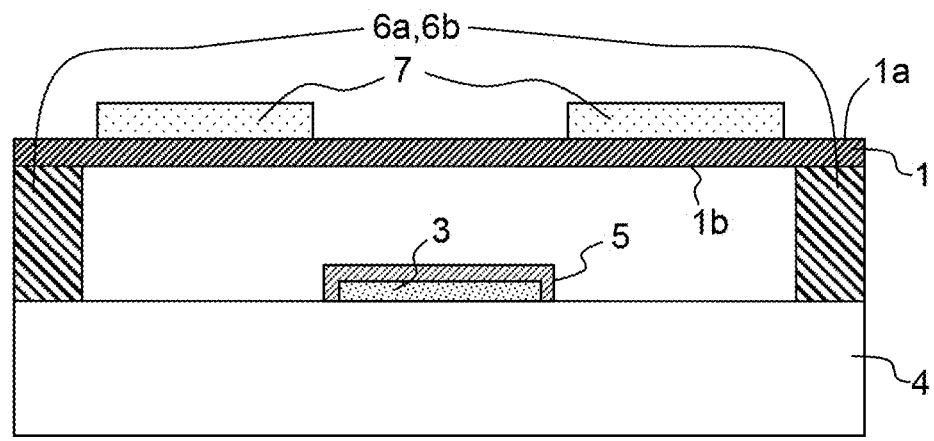
FIG. 4 represents a profile view of an RF MEMS according to a first embodiment of the invention.

A membrane 1 generally comprising gold or copper and of small thickness, of the order of 1 μm, is held suspended over ground lines 6a; 6b above a radiofrequency transmission line 3 in which a signal Sig is propagated, the transmission line 3 is produced on the surface of a substrate 4. In this instance, the height of the air gap or first height between the substrate 4 and the membrane 1 is of the order of a micron.

Furthermore, the upper face 1a of the membrane 1 is partially covered with a first layer 7 comprising a refractory metallic material, typically the refractory metallic material comprises molybdenum or tungsten.

By refractory metallic material is meant a metal capable of absorbing a high thermal load while maintaining its physical and mechanical cohesion, in particular. In other words, a refractory metallic material will not deform under the effect of temperature.

Preferentially, the first refractory metallic layer is disposed on the parts of the membrane 1 that are disposed directly opposite a part of the substrate 4, and, more particularly, on the boundaries of the membrane 1 opposite the substrate 4 and in direct contact with the air of the air gap. In other words, the first refractory metallic layer is disposed on parts of the upper face 1a of the membrane 1 which link the RF transmission line 3 to the ground planes 6a; 6b.

The thickness of the first layer 7 is between 1 and 3 microns. The localized addition of the first layer 7 of refractory metallic material on the surface of the membrane 1 makes it possible to decrease the ohmic resistance locally, thereby engendering a decrease in the energy dissipated through the Joule effect and thus decreasing the heating of the membrane 1.

Figure 5:
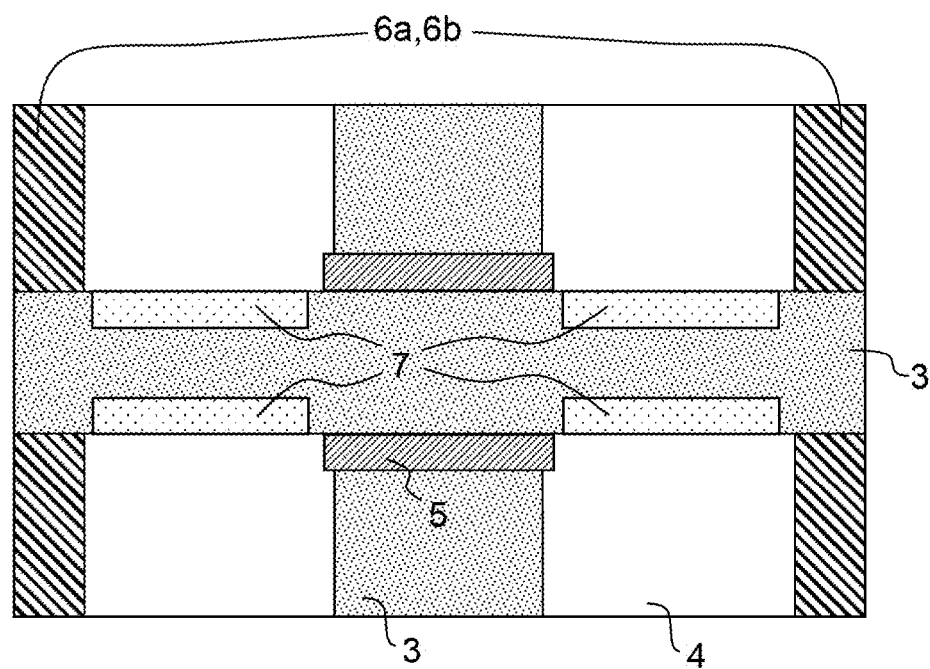
FIG. 5 represents a view from above of an RF MEMS according to the first embodiment of the invention.

FIG. 5 is a view from above of the membrane of an RF MEMS according to the first embodiment of the invention.

The upper face 1a of the membrane 1 is covered locally with a first layer 7 of refractory metallic material Mat 1. The first layer 7 of refractory metallic material Mat 1 is disposed on the membrane 1 opposite the substrate 4 in direct contact with the air of the air gap.

In this instance, the first layer 7 of refractory metallic material is disposed on the boundaries of the membrane opposite the substrate, the width of the boundaries being dependent on the applied frequencies. It is however possible to cite as example, a boundary width of about 10 microns for a frequency of 10 GHz.

The RF MEMS according to the first embodiment of the invention allows a strengthening of the membrane 1 while locally limiting the increase in the temperature generated by the flow of the current in the membrane 1.

The proposed RF MEMS exhibits an air gap of the order of a micron, the deformations of the membrane 1 that are engendered locally by the temperature variations as a function of the region of the membrane 1 have little impact on the reliability of the RF MEMS.

On the other hand, for applications requiring a very short switching time, it is necessary to produce an RF MEMS in which the air gap is submicronic, typically 500 nm. Local deformations of the membrane 1 engendered by temperature differences from one region to another of the membrane 1 generate malfunctions of the RF MEMS.

Indeed, under the effect of the temperature increase, the membrane 1 generally comprising gold or copper, a very good electrical conductor, softens and deforms, the height of the air gap is not constant over the whole surface of the membrane 1.

The second embodiment of the RF MEMS according to the invention allows the production of RF MEMS with a small air gap, typically of the order of 500 nm, and able to support high powers, greater than or equal to 15 W.

Figure 6:
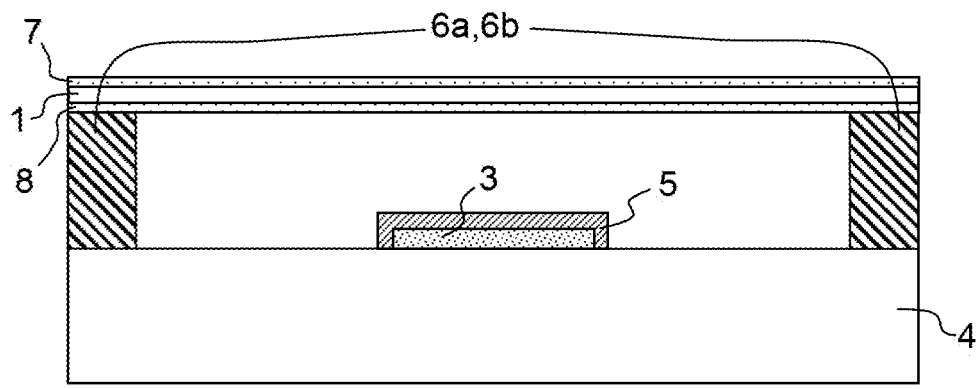
FIG. 6 represents a profile view of an RF MEMS according to a second embodiment of the invention.

FIG. 6 represents a second embodiment of the invention. The RF MEMS comprises a membrane 1 of small thickness, of the order of 500 nm, held suspended over ground lines 6a; 6b above a transmission line 3 in which a signal Sig is propagated. The air gap is of the order of 500 nm thereby permitting a short switching time of less than a microsecond.

The membrane 1 comprising a metallic material, generally gold or copper, is entirely covered on its upper face by a first layer 7 of refractory metallic material, such as molybdenum or tungsten, and on its lower face by a second layer 8 of refractory material Mat 2, the coefficients of thermal elongation of the first 7 and of the second 8 layer compensating one another in such a way as to contain the membrane 1 and prevent local deformations of the membrane 1 while decreasing the ohmic resistance. Advantageously, the first layer 7 and the second 8 layers have a thickness of between 100 and 200 nm. Preferentially, the first 7 and the second 8 layers are identical.

Thus, the membrane 1 remains substantially plane in the course of the operation of the RF MEMS. In other words, the membrane 1 does not deform, and does not curve.

This greater stability permits the RF MEMS according to the invention to be used at higher powers.

Furthermore, this greater stability due to the greater stiffness of the membrane 1 makes it possible to decrease the first gap and to obtain a lower switching time, the membrane being stiffer, the risk of short circuiting due to deformation of the membrane 1 is lower.

The RF MEMS thus produced increases the stiffness of the membrane 1, the latter no longer deforms under the effect of the temperature rise and thus avoids malfunctions of the RF MEMS.

The invention claimed is:

1. A capacitive radiofrequency MicroElectroMechanical System or capacitive RF MEMS for high-power applications comprising a membrane suspended above an RF transmission line and resting on ground planes, the membrane exhibiting a lower face and an upper face opposite to the lower face, wherein said membrane comprises a metallic material and in that a first layer comprising a refractory metallic material different from the metallic material of the membrane, said first layer at least partially covers the upper face of the membrane so as to prevent the heating of the membrane.

2. The RF MEMS of claim 1, in which the thickness of the first layer of refractory metallic material is between 1 and 3 microns.

3. The RF MEMS of claim 1, in which the first layer of refractory metallic material is disposed on the parts of the upper face of the membrane which link the RF transmission line to the ground planes when the membrane is in a low state.

4. The RF MEMS of claim 3, in which the first layer of refractory metallic material is disposed on the boundaries of the parts of the upper face of the membrane which link the RF transmission line to the ground planes when the membrane is in the low state.

5. The RF MEMS of claim 1, in which the first layer of refractory metallic material covers the totality of the upper face of the membrane and a second layer covers the totality of the lower face of the membrane, the coefficients of thermal elongation of the first and of the second layer compensating one another so as to contain the deformations of the membrane.

6. The RF MEMS of claim 5, in which the first layer of refractory metallic material and the second layer are identical.

7. The RF MEMS of claim 5, in which the thickness of the first and of the second layer is less than or equal to 200 nm.

8. The RF MEMS of claim 2 in which the first layer of refractory metallic material is disposed on the parts of the upper face of the membrane which link the RF transmission line to the ground planes when the membrane is in a low state.

9. The RF MEMS of claim 8 in which the first layer of refractory metallic material is disposed on the boundaries of the parts of the upper face of the membrane which link the RF transmission line to the ground planes when the membrane is in the low state.

10. The RF MEMS of claim 6 in which the thickness of the first and of the second layer is less than or equal to 200 nm.

* * * * *